United States Patent
Kim et al.

(10) Patent No.: US 7,646,012 B2
(45) Date of Patent: Jan. 12, 2010

(54) ORGANIC THIN FILM TRANSISTOR AND MANUFACTURING METHOD THEREOF

(75) Inventors: Sung Jin Kim, Yongin-si (KR); Taek Ahn, Yongin-si (KR); Min-Chul Suh, Yongin-si (KR); Sin-Doo Lee, Seoul (KR)

(73) Assignees: Samsung Mobile Display Co., Ltd., Suwon-si, Gyeonggi-do (KR); Seoul National University Industry Foundation, Seoul (KR)

( * ) Notice: Subject to any disclaimer, the term of this patent is extended or adjusted under 35 U.S.C. 154(b) by 42 days.

(21) Appl. No.: 11/505,912

(22) Filed: Aug. 18, 2006

(65) Prior Publication Data

US 2007/0040169 A1   Feb. 22, 2007

(30) Foreign Application Priority Data

Aug. 18, 2005   (KR) .................... 10-2005-0075928

(51) Int. Cl.
*H01L 35/24* (2006.01)
*H01L 51/00* (2006.01)

(52) U.S. Cl. ................. 257/40; 257/E51.001
(58) Field of Classification Search .......... 257/40, 257/E51.001
See application file for complete search history.

(56) References Cited

U.S. PATENT DOCUMENTS 5,851,705 A * 12/1998 Lee .................. 430/5
6,696,370 B2 * 2/2004 Jackson ................ 438/780
2002/0075424 A1 * 6/2002 Sakamoto et al. .......... 349/43
2003/0011738 A1 * 1/2003 Akiyama et al. .......... 349/156
2003/0059975 A1 * 3/2003 Sirringhaus et al. ........ 438/99
2005/0003640 A1 * 1/2005 Ushiyama et al. .......... 438/502
2005/0045885 A1 * 3/2005 Kim et al. ............... 257/66
2005/0176185 A1 * 8/2005 Jang et al. .............. 438/155
2005/0242342 A1 * 11/2005 Suh et al. ............... 257/40
2005/0285102 A1 * 12/2005 Koo et al. ............... 257/40

OTHER PUBLICATIONS

Kim, Sung-Jin, et al, "Low-Leakage Polymeric Thin-Film Transistors Fabricated by Laser Assisted Lift-Off Technique", Japanese Journal of Applied Physics, vol. 44, No. 35, pp. L 1109-L 1111, (2005).

* cited by examiner

*Primary Examiner*—Kenneth A Parker
*Assistant Examiner*—Anthony Ho
(74) *Attorney, Agent, or Firm*—Lee & Morse, P.C.

(57) ABSTRACT

An organic thin film transistor includes a substrate, a gate electrode, a gate insulating layer, a first electrode, and a second electrode disposed on the substrate, a first layer disposed on the substrate, the first layer being photosensitive, a second layer disposed on the first layer, the second layer being hydrophobic, an opening defined in the first and second layers, the opening corresponding to the gate electrode, and a hydrophilic organic semiconductor disposed in the opening.

20 Claims, 5 Drawing Sheets

ORGANIC THIN FILM TRANSISTOR AND MANUFACTURING METHOD THEREOF

BACKGROUND OF THE INVENTION

1. Field of the Invention

The present invention relates to an organic thin film transistor and a manufacturing method thereof.

2. Description of the Related Art

A flat panel display such as a liquid crystal display (LCD), an organic light emitting diode (OLED) display, an electrophoretic display, etc., may include pairs of field generating electrodes combined with electro-optical active layers disposed between the field generating electrodes. The electro-optical layers may be, e.g., liquid crystal layers in the LCD, organic light emitting layers in the OLED display, etc.

One of the field generating electrodes may be coupled to a switching element and may receive electrical signals from the switching element. A common switching element for flat panel displays is a three-terminal thin film transistor (TFT). The electro-optical layer may then convert the electrical signals into optical signals to display images.

The flat panel display may further include signal lines, e.g., gate lines and data lines. The gate lines may transmit scanning signals for controlling the TFTs and the data lines may transmit data signals to be applied to the field generating electrodes through the TFTs.

Recently, interest in organic thin film transistors (OTFTs) has increased. OTFTs may employ an organic semiconductor instead of an inorganic, e.g., silicon, semiconductor. OTFTs have characteristics that may be advantageous in the manufacture of flat panel displays. For example, OTFTs may be manufactured using a low temperature solution process and, thus, may be advantageously applied to the manufacture of large display devices, which may be difficult to manufacture using the deposition processes conventionally required for inorganic semiconductors. Additionally, OTFTs may be easily formed in fibers or films due to the characteristics of the organic material, and thus may be suitable for use in flexible display devices.

The OTFT may include a channel region of organic semiconductor, which may be formed by dissolving the organic semiconductor into a solvent to make a solution and coating the solution on a substrate. However, such formation of the channel region may require precise control of the deposition of the solution in order to exactly control the size of the channel layers and, thus, obtain uniform operational characteristics of the OTFTs.

SUMMARY OF THE INVENTION

The present invention is therefore directed to an organic thin film transistor and manufacturing method thereof, which substantially overcome one or more of the problems due to the limitations and disadvantages of the related art.

It is therefore a feature of an embodiment of the present invention to provide an organic thin film transistor having an organic semiconductor layer defined by a patterned hydrophobic layer.

It is therefore a further feature of an embodiment of the present invention to provide an organic thin film transistor having a photosensitive layer underlying the hydrophobic layer, the photosensitive layer being used to pattern the hydrophobic layer.

It is therefore another feature of an embodiment of the present invention to provide a method of forming a patterned organic semiconductor layer, the method including forming a patterned hydrophobic layer and applying a hydrophilic organic semiconductor to the patterned hydrophobic layer, such that the hydrophilic organic semiconductor is deposited in openings in the patterned hydrophobic layer.

It is therefore yet another feature of an embodiment of the present invention to provide a method of forming a patterned organic semiconductor layer, the method including patterning a hydrophobic layer by removing portions of an underlying photosensitive layer to create openings in the hydrophobic layer.

At least one of the above and other features and advantages of the present invention may be realized by providing an organic thin film transistor including a substrate, a gate electrode, a gate insulating layer, a first electrode, and a second electrode disposed on the substrate, a first layer disposed on the substrate, the first layer being photosensitive, a second layer disposed on the first layer, the second layer being hydrophobic, an opening defined in the first and second layers, the opening corresponding to the gate electrode, and a hydrophilic organic semiconductor disposed in the opening.

The gate electrode, the gate insulating layer, and the first and second electrodes may be sequentially disposed on the substrate, the opening may expose portions of the gate insulating layer and the first and second electrodes, and the hydrophilic organic semiconductor may be in contact with the exposed portions of the first and second electrodes. The second layer may include a fluorinated polymer. The fluorinated polymer may include at least one of:

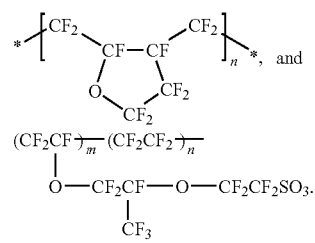

The first layer may be sensitive to light having a wavelength of less than or equal to about 248 nm. The first layer may have positive photosensitivity. The hydrophilic organic semiconductor may include poly(9-9-dioctylfluorene-co-bithiophene).

At least one of the above and other features and advantages of the present invention may also be realized by providing a method of manufacturing an organic thin film transistor, the method including forming a gate electrode, a gate insulating layer, a first electrode, and a second electrode on a substrate, forming a photosensitive film on the substrate, forming a hydrophobic film on the photosensitive film, selectively removing a portion of the photosensitive film by exposing the photosensitive film to a first light source to form an opening in the photosensitive film and the hydrophobic film, the opening exposing portions of the first and second electrodes, and coating a hydrophilic organic semiconductor on an entire surface of the substrate such that hydrophilic organic semiconductor remains in the opening.

The gate electrode may be formed between the substrate and the gate insulating layer, and the first and second electrodes may be formed on the gate insulating layer. The first electrode may be a source electrode and the second electrode may be a drain electrode. Exposing the photosensitive film to the first light source may cause ablation of the photosensitive film, such that the portion of the photosensitive film may be removed and a corresponding portion of the hydrophobic film may be removed.

The selective removal of the portion of the photosensitive film may include exposing the photosensitive film to a laser light source using a photo mask. The laser light source may be an excimer laser light source. Coating the hydrophilic organic semiconductor on the substrate may include providing a solution of the hydrophilic organic semiconductor in a solvent, coating the solution on the substrate, and subsequently, removing the solvent.

The photosensitive film and the hydrophobic film may be electrically insulating films. The hydrophobic film may include a fluorinated polymer. The hydrophobic film may include at least one of

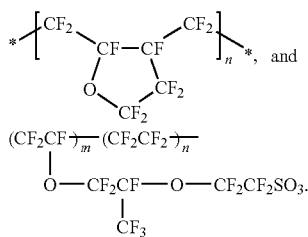

The photosensitive film may be sensitive to light having a wavelength of less than or equal to about 248 nm. The photosensitive film may have positive photosensitivity. The hydrophilic organic semiconductor may include poly(9-9-dioctylfluorene-co-bithiophene). The hydrophilic organic semiconductor may be dissolved in a solvent that includes xylene.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF INVENTION

Figure 1:
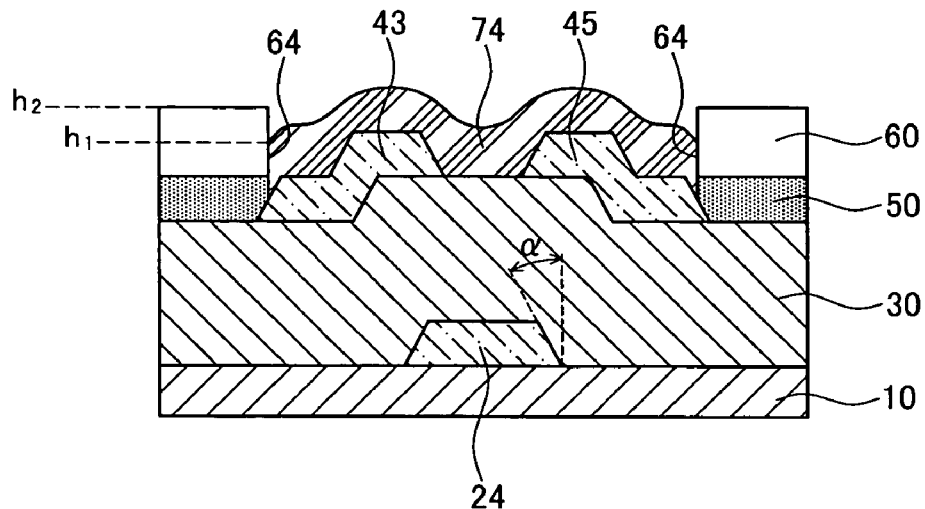
FIG. 1 illustrates a sectional view of an OTFT according to an embodiment of the present invention.

Korean Patent Application No. 10-2005-0075928 filed on Aug. 18, 2005, in the Korean Intellectual Property Office, and entitled: "Organic Thin Film Transistor and Manufacturing Method Thereof," is incorporated by reference herein in its entirety.

Additionally, a thesis entitled "Reflective LCD in a Polymeric TFT Array Fabricated by Laser Assisted Lift-Off," by Sung-Jim KIM, School of Electrical Engineering #32, Seoul National University, Seoul, Korea, is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Embodiments of the present invention may include forming regions of organic semiconductor in a plurality of OTFTs by using a pattern of hydrophilic areas and hydrophobic areas defined on a substrate using a photo mask. A method of forming an OTFT according to an embodiment of the present invention may provide a simplified process for forming the OTFTs that yields increased accuracy while reducing production costs.

An OTFT according to an embodiment of the present invention will be described in detail with reference to FIG. 1, which illustrates a sectional view of an OTFT according to an embodiment of the present invention. Referring to FIG. 1, the OTFT may include a gate electrode 24 disposed on a substrate 10. The gate electrode 24 may be connected to a gate line (not shown) disposed on the substrate 10. The substrate 10 may be an insulating substrate formed of, e.g., transparent glass, plastic, etc. The substrate 10 may be a flexible substrate and may be a substrate requiring relatively low temperature processes.

The gate electrode 24 may be made of, e.g., an Al-containing metal such as Al and Al alloy, a Ag-containing metal such as Ag and Ag alloy, a Cu-containing metal such as Cu and Cu alloy, a Mo-containing metal such as Mo and Mo alloy, Cr, Ta, Ti, or various other metals or conductors. The gate electrode 24 may have a multi-layered structure including two conductive films (not shown) having different physical characteristics. One of the two conductive films may be a low-resistivity metal, e.g., an Al-containing metal, a Ag-containing metal, a Cu-containing metal, etc., in order to reduce signal delay and/or voltage drop. The other conductive film may be, e.g., a material such as a Mo-containing metal, Cr, Ta, or Ti, which has good physical, chemical, and electrical contact characteristics with other materials such as organic semiconductor. Examples of the combination of the two films may include, e.g., a lower Cr film and an upper Al (alloy) film, a lower Al (alloy) film and an upper Mo (alloy) film, etc. Lateral sides of the gate electrode 24 may be inclined, relative to a normal to the major surface of the substrate 10, at an angle α of about 30 to about 80 degrees.

The OTFT may include a gate insulating layer 30 disposed on the gate electrode 24. The gate insulating layer 30 may be, e.g., silicon nitride, silicon oxide, etc. First and second electrodes 43 and 45, e.g., source and drain electrodes, may be disposed on the gate insulating layer 30. The source electrode 43 and the drain electrode 45 may be disposed opposite each other with respect to the gate electrode 24.

The source electrode 43 and the drain electrode 45 may be made of, e.g., an Al-containing metal, a Ag-containing metal, a Cu-containing metal, a Mo-containing metal such as a Mo—W alloy, Cr, Ta, Ti, etc. The source electrode 43 and the drain electrode 45 may have a multilayered structure (not shown) including a good-contact metal film and a low resistivity film.

A photosensitive layer 50 and a hydrophobic layer 60 may be sequentially disposed on the source electrode 43, the drain electrode 45, and the gate insulating layer 30. The photosensitive layer 50 may include a light-sensitive material, e.g., an ultraviolet (UV) light-sensitive material. The light-sensitive material may absorb light having a first wavelength. The first wavelength may be, e.g., less than or equal to about 248 nm, such as that generated by an excimer laser. Examples of such a light-sensitive material may include, e.g., TDUR-series materials such as TDUR-P015 (Tokyo Ohka Kogyo), SU-8 (Microchem Co.), etc.

The hydrophobic layer 60 may include a hydrophobic material such as a fluorinated polymer, e.g., CYTOP (Asahi Glass), Nafion (E. I. du Pont de Nemours and Company Corp.), Fluorad (3M), Teflon AF (Du Pont Polymers), etc. The hydrophobic layer 60 may be substantially transparent to the light having the first wavelength. In an implementation, the photosensitive layer 50 may absorb light at the first wavelength, e.g., about 248 nm, while the hydrophobic layer 60 may be substantially transparent to the light.

Chemical structures of CYTOP and Nafion are described below:

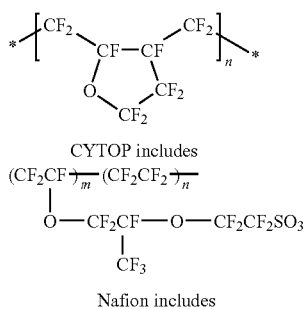

CYTOP includes $(CF_2CF)_m—(CF_2CF_2)_n—$
|
O—$CF_2CF$—O—$CF_2CF_2SO_3$
|
$CF_3$ Nafion includes The photosensitive layer 50 and the hydrophobic layer 60 may have an opening 64 defined therein corresponding to the gate electrode 24. The opening 64 may expose portions of the source electrode 43 and the drain electrode 45. The opening 64 may expose portions of the electrodes 43 and 45 that are disposed on the gate electrode 24, and may allow for contact between the electrodes 43 and 45 and an organic semiconductor 74.

The organic semiconductor 74 may be disposed in the opening 64 in the photosensitive layer 50 and the hydrophobic layer 60. The organic semiconductor 74 may contact the source electrode 43 and the drain electrode 45 on the gate electrode 24. The organic semiconductor 74 may be substantially confined to the opening 64, such that the organic semiconductor 74 is not disposed on an upper surface of the hydrophobic layer 60. The substrate 10 may include a plurality of openings 64, and the organic semiconductor 74 may be disposed in each of the openings 64 so as to form a plurality of active devices. A protection layer (not shown) for protecting the organic semiconductor 74 may be formed on the organic semiconductor 74.

A top surface of the organic semiconductor 74 at an edge of the opening 64 may have a height $h_1$ that is equal to or lower than a corresponding height $h_2$ of a top surface of the hydrophobic layer 60 at boundaries of the opening 64, such that the organic semiconductor 74 may be contained in the opening 64.

The organic semiconductor 74 may include a hydrophilic high molecular weight compound or low molecular weight compound such as, e.g., poly(9-9-dioctylfluorene-co-bithiophene) (F8T2), which tends to be soluble in polar solvents.

Taken together, the gate electrode 24, source electrode 43, drain electrode 45, and organic semiconductor 74 may form the active components of the OTFT, with a channel region in the organic semiconductor 74 being disposed between the source electrode 43 and the drain electrode 45. The OTFT may be suitable for use in, e.g., flat panel displays such as OLED displays, LCDs, etc.

Although a particular OTFT structure is described above, it will be appreciated that this structure is merely exemplary. Thus, it will be appreciated that the relative positions of the gate electrode 24, the source electrode 43, the drain electrode 45, and the organic semiconductor 74 are not limited to the exemplary structure, and may be arranged as needed for a particular application.

Figure 2:
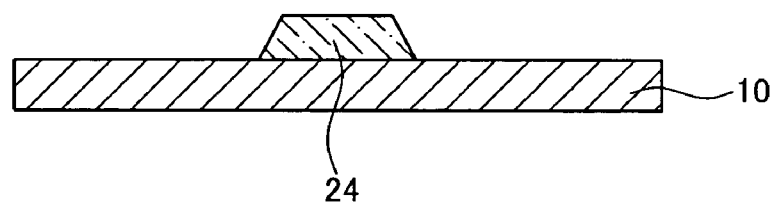
FIGS. 2-6 illustrate stages in a method of manufacturing an OTFT according to an embodiment of the present invention.

A method of manufacturing the OTFT shown in FIG. 1 according to an embodiment of the present invention will now be described in detail with reference to FIGS. 2-6, which illustrate stages in a method of manufacturing an OTFT according to an embodiment of the present invention. Referring to FIG. 2, a metal layer may be formed on a substrate 10. The metal layer may be patterned to form the gate electrode 24, e.g., using lithography and etch processes. The metal layer may include, e.g., a Mo—W alloy, and the substrate 10 may be, e.g., an insulating substrate and/or flexible substrate. The substrate 10 may be formed of, e.g., transparent glass, plastic, etc.

Figure 3:
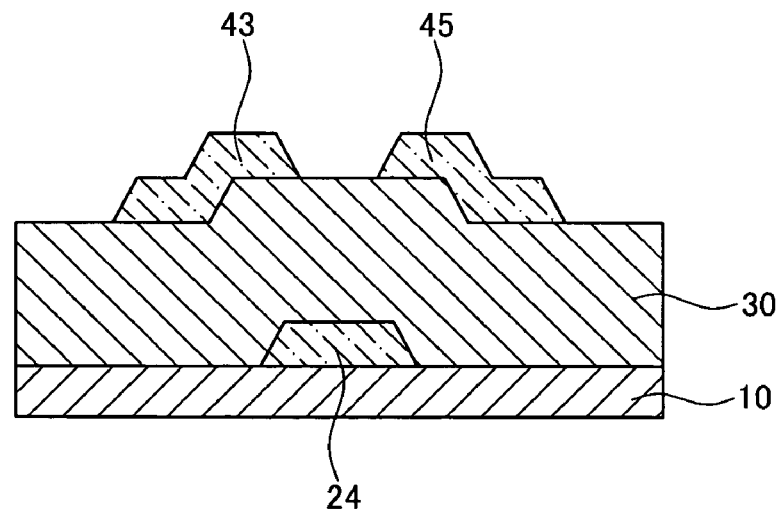

Referring to FIG. 3, the gate insulating layer 30 may be formed on the substrate 10 and the gate electrode 24. The gate insulating layer 30 may be, e.g., a silicon oxide layer, a silicon nitride layer, etc. Thereafter, a metal layer may be formed on the gate insulating layer 30. The metal layer may be, e.g., a Mo—W alloy, and may be deposited and patterned by lithography and etch. The metal layer may be patterned to form the source electrode 43 and the drain electrode 45.

Figure 4:
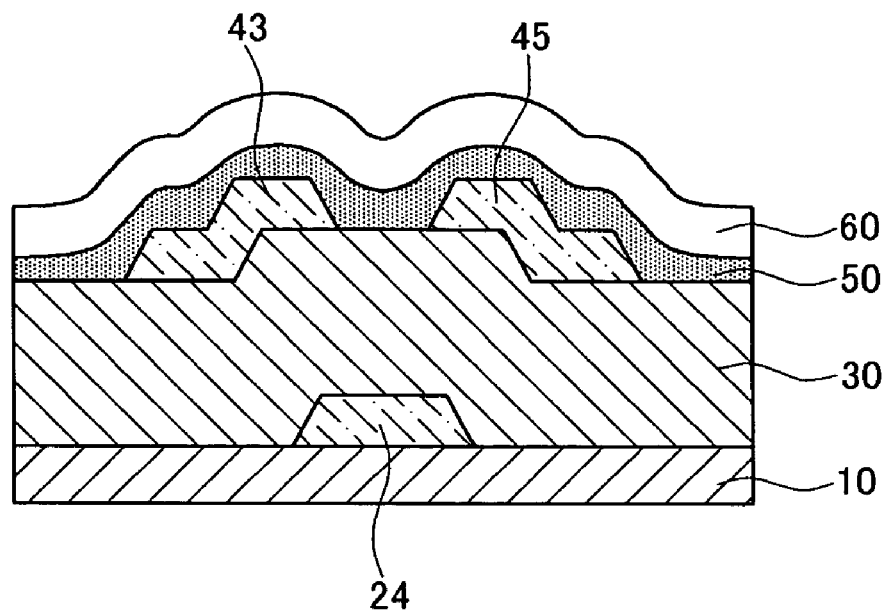

Referring to FIG. 4, the photosensitive layer 50 and the hydrophobic layer 60 may be formed on the substrate 10. The hydrophobic layer 60 may be stacked on the photosensitive layer 50, and both layers may cover the gate insulating layer 30, the source electrode 43 and the drain electrode 45. The layers 50 and 60 may be applied by, e.g., spin coating, slit coating, etc.

The photosensitive layer 50 may be an organic insulator having positive photosensitivity, e.g., TDUR-P105. The photosensitive layer 50 may be sensitive to light having a first wavelength, e.g., UV light having a wavelength of less than or equal to about 248 nm, such as that generated by an excimer laser. The photosensitive layer 50 may be ablated upon irradiation with light having the first wavelength.

The hydrophobic layer 60 may be substantially transparent to the light having the first wavelength, so as to transmit the light to the underlying photosensitive layer 50. The photosensitive layer 50 underlying the hydrophobic layer 60 may allow the hydrophobic layer to be selectively patterned by directing light having the first wavelength at a region of the photosensitive layer 50 so as to cause ablation of the region of the photosensitive layer 50 and concomitant removal of a corresponding region of the hydrophobic layer 60. Thus, light-based patterning of the hydrophobic layer 60 may be achieved even where the hydrophobic layer 60 is not sensitive to the light.

The hydrophobic layer 60 may include a hydrophobic fluorinated polymer such as CYTOP. The hydrophobic layer 60 may be patterned, using the underlying photosensitive layer 50, so as to form a pattern of hydrophilic regions in the hydrophobic layer 60. The pattern of hydrophilic regions may be used to form a pattern of hydrophilic organic semiconductor regions, as described in additional detail below.

Figure 5:
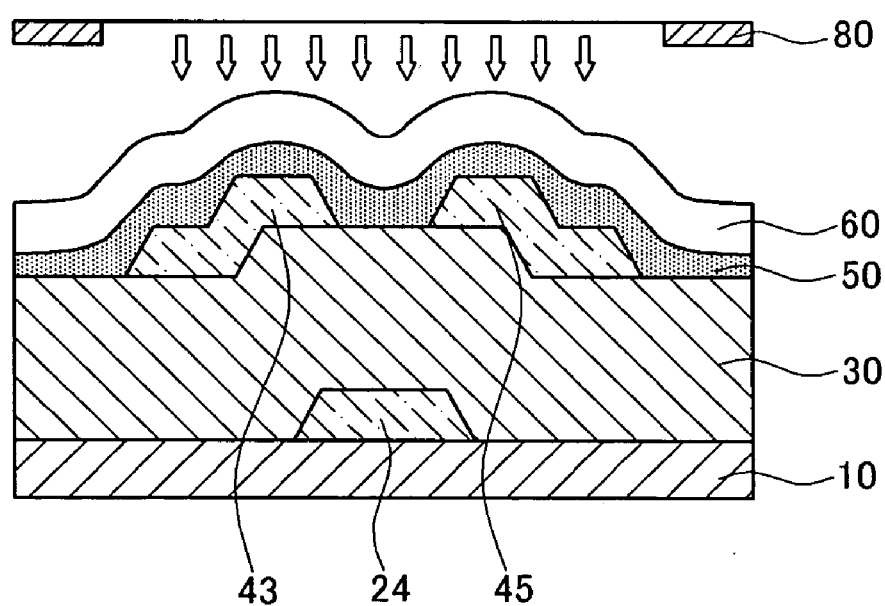

Referring to FIG. 5, a photo mask 80 having an aperture may be aligned with the substrate 10. The photo mask 80 may include a substrate, e.g., a quartz substrate, etc., and an opaque layer disposed on the substrate. The aperture may be an area where there is no opaque layer. The aperture may be aligned with the active region to be formed, i.e., aligned with the gate electrode 24, the source electrode 43, and the drain electrode 45.

Figure 6:
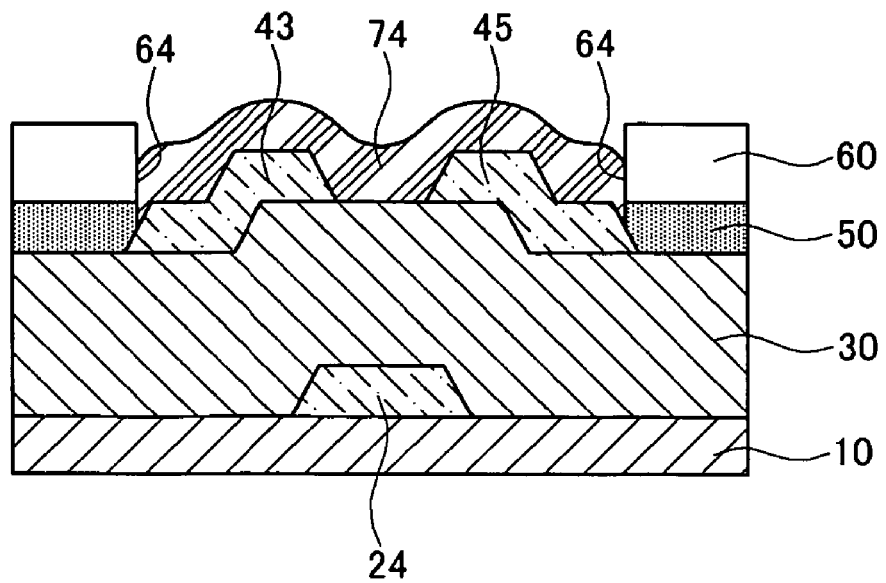

Light having the first wavelength may be irradiated on the photosensitive layer 50. For example, in an implementation, a UV excimer laser beam having a predetermined wavelength, for example, equal to or less than about 280 nm, may be directed at the substrate 10 through the photo mask 80. As selected regions of the photosensitive layer 50 corresponding to the aperture of the photo mask 80 receive the UV light they may be removed, while other portions that are not exposed to light remain. The hydrophobic layer 60 may be removed in regions corresponding to the removed regions of the photosensitive layer 50. That is, the regions of the hydrophobic layer 60 disposed on the irradiated portions of the photosensitive layer 50 may be removed to form the opening 64, as shown in FIG. 6.

The photosensitive layer 50 may have positive photosensitivity, and the hydrophobic layer 60 may have substantially no photosensitivity, such that the portions of the photosensitive layer 50 that are exposed to light may be removed after development.

A contact angle of a solution of the organic semiconductor 74 with respect to the hydrophobic surface of the hydrophobic layer 60 may be large. However, the contact angle may be small in the region(s) where the hydrophobic layer 60 and the photosensitive layer 50 are removed, i.e., in the opening 64. This difference in contact angles may be used to selectively deposit the organic semiconductor 74 in regions corresponding to the openings 64.

Where the hydrophobic layer 60 includes CYTOP, the contact angle may vary depending on the intensity of illuminated UV light. In particular, a more intense UV light may result in a reduced contact angle, as illustrated in FIG. 7.

Figure 7:
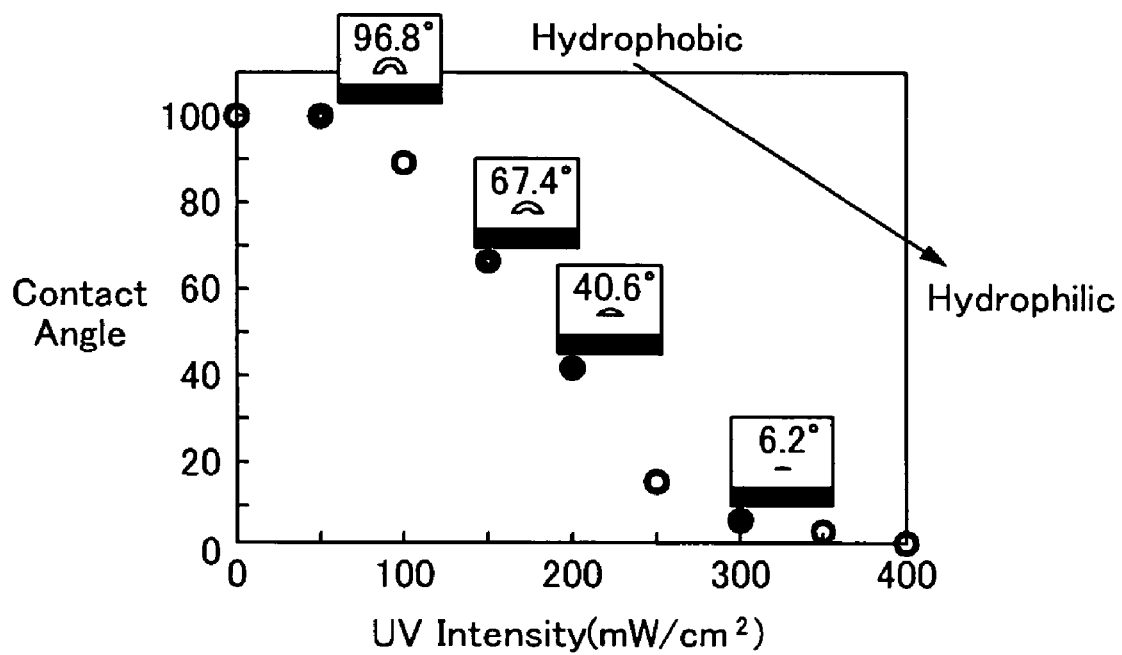
FIG. 7 illustrates a graph of contact angle as function of UV light intensity.

FIG. 7 illustrates a graph of contact angle as function of UV light intensity, which was measured after dropping xylene on a CYTOP film. Referring to FIG. 7, the contact angle is equal to about 97 degrees when the UV light is weak, while the contact angle is equal to about 6 degrees when the energy of the illuminated UV light is equal to about 300 mW/cm². Thus, the region irradiated by the UV light exhibits hydrophilicity, i.e., the surface exposed through the opening 64, where metal and inorganic material may be exposed, shows hydrophilicity.

Referring again to FIG. 6, a pattern of the organic semiconductor 74 may be formed. In an implementation, a hydrophilic organic semiconductor 74, e.g., F8T2, may be dissolved in a suitable solvent, e.g., a polar solvent, xylene, etc., to form a solution, and the solution may be coated on an entire surface of the substrate 10, including the upper surface of the hydrophobic layer 60 and in the opening 64. The organic semiconductor 74 may be dissolved in the solvent at about 1 wt %.

The contact angle of the solution may be large at the surface of the hydrophobic layer 60 and small in the opening 64. Accordingly, the solution may gather in the opening 64. Subsequently, the solvent may removed, e.g., by drying, etc., leaving behind the organic semiconductor 74 only in the opening 64.

Thus, in the method according to this embodiment of the present invention, a pattern of the organic semiconductor 74 may be formed by using a pattern of hydrophilic and hydrophobic areas defined on the substrate 10. Therefore, the method may provide a simplified process, enable increased accuracy and reduce costs.

Figure 8:
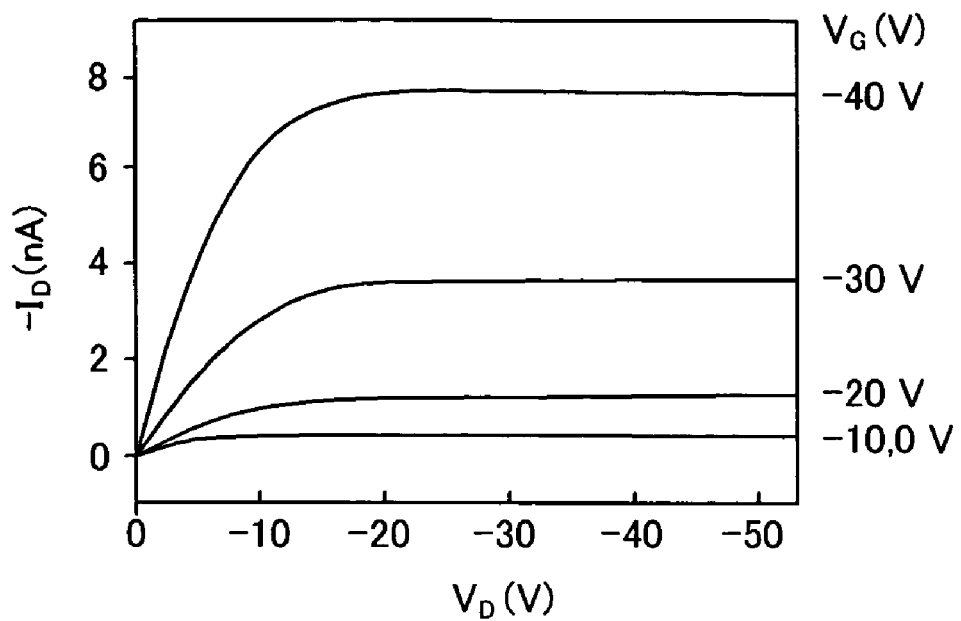
FIG. 8 illustrates a graph of drain current as function of drain voltage for various gate voltages in an OTFT according to an embodiment of the present invention.

Characteristics of an exemplary OTFT manufactured according to the above-described method will be described in detail with reference to FIGS. 8-10. FIG. 8 illustrates a graph of drain current as function of drain voltage for various gate voltages in an OTFT according to an embodiment of the present invention, FIG. 9 illustrates a graph of drain current and the square root thereof as function of the gate voltage in an OTFT according to an embodiment of the present invention, and FIG. 10 illustrates a graph of current leakage as function of gate voltage in an OTFT according to an embodiment of the present invention and in a conventional OTFT.

The channel length of the manufactured OTFTs was about 20 microns, and the channel width was about 1800 microns. Measurements were performed at room temperature in air. Referring to FIG. 8, the gate voltage $V_G$ was varied at 0, −10, −20, −30, and −40 volts while measuring the drain current $I_D$. The linear region and the saturation region shown by the graph represent those of a typical field effect transistor.

Figure 9:
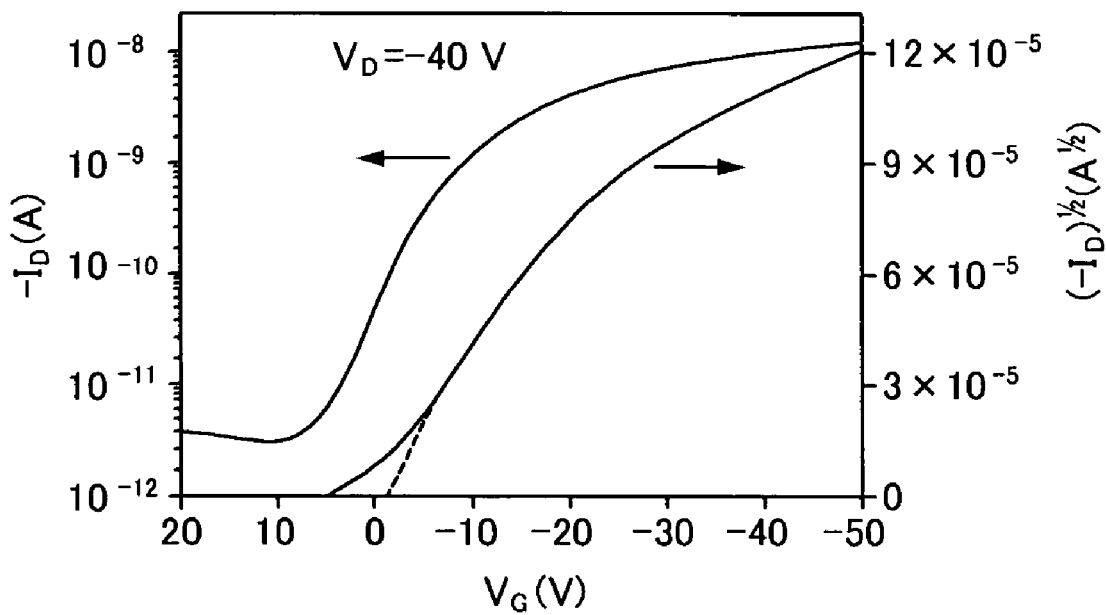
FIG. 9 illustrates a graph of drain current and the square root thereof as function of the gate voltage in an OTFT according to an embodiment of the present invention.
Figure 10:
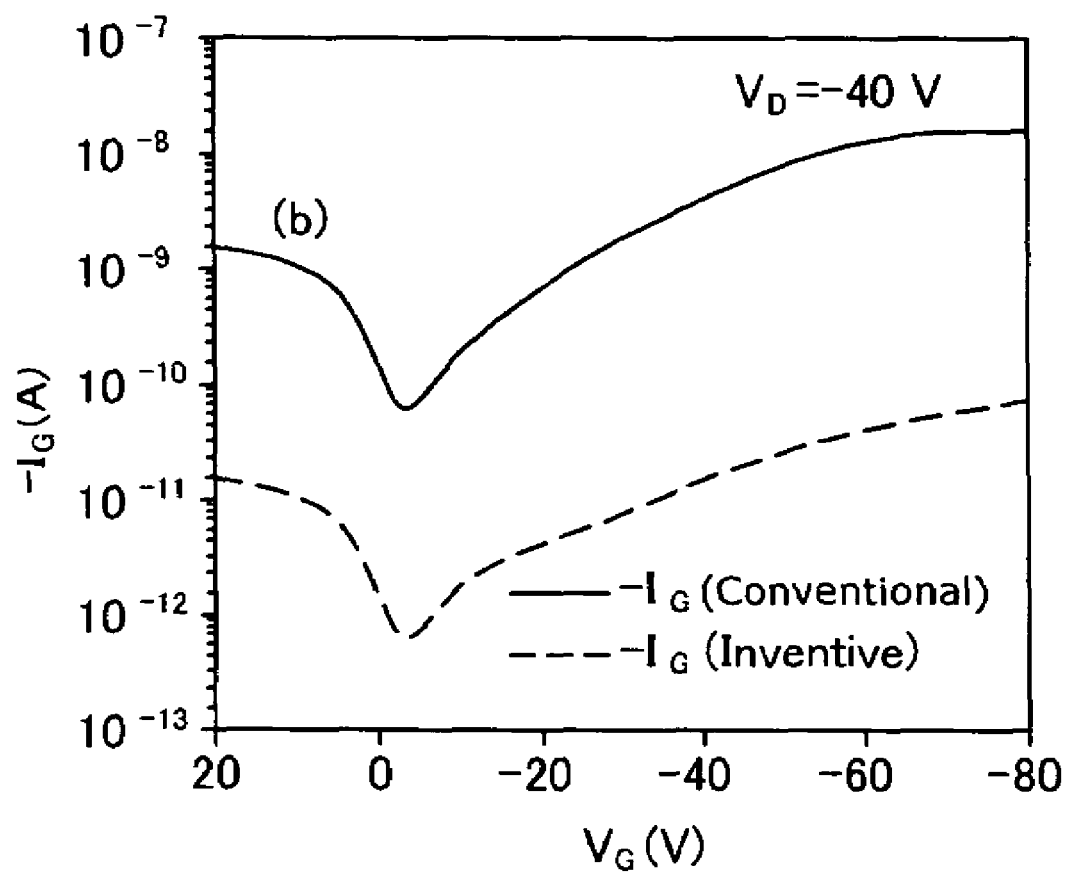
FIG. 10 illustrates a graph of current leakage as function of gate voltage in an OTFT according to an embodiment of the present invention and in a conventional OTFT.

The curve shown in FIG. 9 illustrates transfer characteristics and is nearly a quadratic function of the gate voltage $V_G$. However, the curve is distorted in the high voltage region due to bias stress.

The mobility μ at the drain voltage $V_D$ of about −40V calculated from the curve was equal to about $9.1 \times 10^{-4}$ cm²/(V·s), which was obtained using Equation 1:

$$I_D = (W/2L)\mu C_i(V_G - V_T)^2 \quad (1)$$

In Equation 1, $I_D$ is the drain current, W is the channel width, L is the channel length, μ is the mobility, Ci is the capacitance of the gate insulating layer 30 per unit area, $V_G$ is the gate voltage, and $V_T$ is the threshold voltage. The threshold voltage $V_T$ was equal to about −2 V, and the on/off ratio was greater than or equal to 103.

Referring to FIG. 10, it is apparent that the current leakage was greatly reduced when the drain voltage $V_D$ was about −40V.

Exemplary embodiments of the present invention have been disclosed herein, and although specific terms are employed, they are used and are to be interpreted in a generic and descriptive sense only and not for purpose of limitation. For example, while embodiments of the present invention have been described in the context of a flat panel display, it will be appreciated that they are not limited thereto. Accordingly, it will be understood by those of ordinary skill in the art that various changes in form and details may be made without departing from the spirit and scope of the present invention as set forth in the following claims.

What is claimed is:

1. An organic thin film transistor comprising:
   a substrate;

a gate electrode, a gate insulating layer, a first electrode, and a second electrode sequentially disposed on the substrate;

a first layer disposed on the substrate, the first layer being photosensitive;

a second layer disposed on the first layer, the second layer being hydrophobic;

an opening defined in the first and second layers, the opening corresponding to the gate electrode and exposing portions of the gate insulating layer and the first and second electrodes; and a hydrophilic organic semiconductor disposed in the opening, the hydrophilic organic semiconductor being in contact with the exposed portions of the first and second electrodes.

2. The organic thin film transistor as claimed in claim 1, wherein the second layer includes a fluorinated polymer.

3. The organic thin film transistor as claimed in claim 2, wherein the fluorinated polymer includes at least one of:

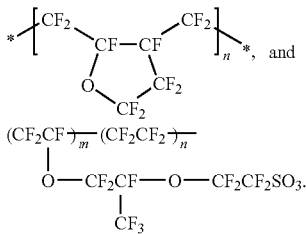

4. The organic thin film transistor as claimed in claim 1, wherein the first layer is sensitive to light having a wavelength of less than or equal to about 248 nm.

5. The organic thin film transistor as claimed in claim 4, wherein the first layer has positive photosensitivity.

6. The organic thin film transistor as claimed in claim 1, wherein the hydrophilic organic semiconductor includes poly (9-9-dioctylfluorene-co-bithiophene).

7. A method of manufacturing an organic thin film transistor, the method comprising:

forming a gate electrode, a gate insulating layer, a first electrode, and a second electrode sequentially on a substrate;

forming a photosensitive film on the substrate;

forming a hydrophobic film on the photosensitive film;

selectively removing a portion of the photosensitive film by exposing the photosensitive film to a first light source to form an opening in the photosensitive film and the hydrophobic film, the opening exposing portions of the gate insulating layer and the first and second electrodes; and coating a hydrophilic organic semiconductor on an entire surface of the substrate such that hydrophilic organic semiconductor remains in the opening, the hydrophilic organic semiconductor being in contact with the exposed portions of the first and second electrodes.

8. The method as claimed in claim 7, wherein the gate electrode is formed between the substrate and the gate insulating layer, and the first and second electrodes are formed on the gate insulating layer.

9. The method as claimed in claim 8, wherein the hydrophobic film includes at least one of

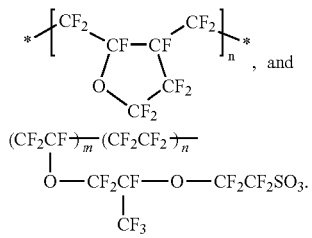

10. The method as claimed in claim 7, wherein the first electrode is a source electrode and the second electrode is a drain electrode.

11. The method as claimed in claim 7, wherein exposing the photosensitive film to the first light source causes ablation of the photosensitive film, such that the portion of the photosensitive film is removed and a corresponding portion of the hydrophobic film is removed.

12. The method as claimed in claim 11, wherein the photosensitive film has positive photosensitivity.

13. The method as claimed in claim 7, wherein the selective removal of the portion of the photosensitive film includes exposing the photosensitive film to a laser light source using a photo mask.

14. The method as claimed in claim 13, wherein the laser light source is an excimer laser light source.

15. The method as claimed in claim 7, wherein coating the hydrophilic organic semiconductor on the substrate includes providing a solution of the hydrophilic organic semiconductor in a solvent;

coating the solution on the substrate; and subsequently, removing the solvent.

16. The method as claimed in claim 15, wherein the hydrophilic organic semiconductor includes poly(9-9-dioctylfluorene-co-bithiophene).

17. The method as claimed in claim 16, wherein the solvent includes xylene.

18. The method as claimed in claim 7, wherein the photosensitive film and the hydrophobic film are electrically insulating films.

19. The method as claimed in claim 7, wherein the hydrophobic film includes a fluorinated polymer.

20. The method as claimed in claim 7, wherein the photosensitive film is sensitive to light having a wavelength of less than or equal to about 248 nm.

* * * * *